United States Patent
Najafi et al.

(10) Patent No.: US 11,830,811 B2
(45) Date of Patent: Nov. 28, 2023

(54) TAPERED CONNECTORS FOR SUPERCONDUCTOR CIRCUITS

(71) Applicant: PsiQuantum Corp, Cupertino, CA (US)

(72) Inventors: Faraz Najafi, Palo Alto, CA (US); Vitor Riseti Manfrinato, San Jose, CA (US)

(73) Assignee: PSIQUANTUM CORP., Palo Alto, CA (US)

( * ) Notice: Subject to any disclaimer, the term of this patent is extended or adjusted under 35 U.S.C. 154(b) by 113 days.

(21) Appl. No.: 17/408,309

(22) Filed: Aug. 20, 2021

(65) Prior Publication Data

US 2021/0384126 A1    Dec. 9, 2021

Related U.S. Application Data

(63) Continuation of application No. 16/575,274, filed on Sep. 18, 2019, now Pat. No. 11,101,215.
(Continued)

(51) Int. Cl.
*H01L 23/528* (2006.01)
*H10N 60/83* (2023.01)
(Continued)

(52) U.S. Cl.
CPC ......... *H01L 23/5283* (2013.01); *H10N 60/83* (2023.02); *H10N 69/00* (2023.02);
(Continued)

(58) Field of Classification Search
None
See application file for complete search history.

(56) References Cited

U.S. PATENT DOCUMENTS 3,059,196 A    10/1962   Lentz
3,119,076 A    1/1964    Schlig et al.
(Continued)

FOREIGN PATENT DOCUMENTS

CN    106289515 A    1/2017
CN    106549099 B    3/2017
(Continued)

OTHER PUBLICATIONS

Clem et al., "Predicted field-dependent increase of critical currents in asymmetric superconducting nanocircuits", Physical Review B 85, 144511 (2012), 16 pages. (Year: 2012).*
(Continued)

*Primary Examiner* — Scott B Geyer
(74) *Attorney, Agent, or Firm* — Morgan, Lewis & Bockius LLP

(57) ABSTRACT

A superconducting circuit includes a first component having a first connection point. The first connection point has a first width. The superconducting circuit includes a second component having a second connection point. The second connection point has a second width that is larger than the first width. The superconducting circuit includes a superconducting connector shaped to reduce current crowding. The superconducting connector electrically connects the first connection point and the second connection point. The superconducting connector includes a first taper positioned adjacent the first connection point and having a non-linear shape and a second taper positioned adjacent the second connection point.

16 Claims, 10 Drawing Sheets

Related U.S. Application Data

(60) Provisional application No. 62/733,553, filed on Sep. 19, 2018.

(51) Int. Cl.
  *H10N 69/00* (2023.01)
  *H01L 23/532* (2006.01)
  *H10N 60/84* (2023.01)
  *H10N 60/85* (2023.01)

(52) U.S. Cl.
  CPC ........ *H01L 23/53285* (2013.01); *H10N 60/84* (2023.02); *H10N 60/855* (2023.02)

(56) References Cited

U.S. PATENT DOCUMENTS

| | | | |
|---|---|---|---|
| 3,283,282 A | 11/1966 | Harvey et al. | |
| 3,399,396 A * | 8/1968 | Rogers | G11C 19/30 365/160 |
| 3,422,529 A * | 1/1969 | Nuding | H01R 4/20 505/928 |
| 3,443,021 A * | 5/1969 | Schrader | H01F 6/06 427/63 |
| 3,523,361 A * | 8/1970 | Weissman | H01R 4/68 505/925 |
| 3,906,538 A * | 9/1975 | Matisoo | H10N 60/12 331/107 S |
| 4,336,561 A | 6/1982 | Murphy | |
| 4,365,317 A | 12/1982 | Gheewala | |
| 4,509,146 A | 4/1985 | Wang et al. | |
| 4,647,954 A | 3/1987 | Graf et al. | |
| 4,894,906 A * | 1/1990 | Huang | H01R 4/68 174/94 R |
| 5,026,682 A | 6/1991 | Clark et al. | |
| 5,030,614 A | 7/1991 | Hollander et al. | |
| 5,030,617 A | 7/1991 | Legge | |
| 5,041,880 A | 8/1991 | Nojima et al. | |
| 5,051,787 A | 9/1991 | Hasegawa | |
| 5,173,620 A | 12/1992 | Fujimaki et al. | |
| 5,219,826 A | 6/1993 | Kapitulnik | |
| 5,219,832 A * | 6/1993 | Zhou | C04B 37/001 505/925 |
| 5,247,475 A | 9/1993 | Hasunuma et al. | |
| 5,321,004 A | 6/1994 | Perez et al. | |
| 5,358,929 A * | 10/1994 | Fujikami | H10N 60/80 505/925 |
| 5,365,476 A | 11/1994 | Mukhanov | |
| 5,376,626 A | 12/1994 | Drehman et al. | |
| 5,455,519 A | 10/1995 | Ohori | |
| 5,481,119 A | 1/1996 | Higashino et al. | |
| 5,521,862 A | 5/1996 | Frazier | |
| 5,574,290 A | 11/1996 | You | |
| 5,583,319 A * | 12/1996 | Lieurance | H01R 4/68 505/925 |
| 5,719,105 A | 2/1998 | Odagawa et al. | |
| 5,825,240 A | 10/1998 | Geis et al. | |
| 5,831,278 A | 11/1998 | Berkowitz | |
| 5,892,644 A | 4/1999 | Evans | |
| 5,925,892 A | 7/1999 | Mizuno et al. | |
| 6,029,075 A | 2/2000 | Das et al. | |
| 6,078,517 A | 6/2000 | Herr | |
| 6,159,905 A * | 12/2000 | Buzcek | H10N 60/80 428/930 |
| 6,242,939 B1 | 6/2001 | Nagasawa | |
| 6,433,974 B2 | 8/2002 | Heismann | |
| 6,774,463 B1 | 8/2004 | Chaudhari et al. | |
| 6,919,579 B2 * | 7/2005 | Amin | H10N 60/12 977/933 |
| 7,227,438 B2 | 6/2007 | Song et al. | |
| 7,513,765 B2 | 4/2009 | Liao | |
| 7,558,030 B2 | 7/2009 | Lee et al. | |
| 7,724,083 B2 | 5/2010 | Herring et al. | |
| 7,847,282 B2 | 12/2010 | Sandhu | |
| 7,852,106 B2 | 12/2010 | Herr et al. | |
| 8,330,145 B2 | 12/2012 | Wakana et al. | |
| 8,565,844 B2 | 10/2013 | Smith | |
| 8,577,430 B1 | 11/2013 | Smith | |
| 8,736,085 B2 | 5/2014 | Sines | |
| 9,293,240 B2 | 3/2016 | Flex-Cable | |
| 9,443,576 B1 | 9/2016 | Miller | |
| 9,500,519 B2 | 11/2016 | Tang et al. | |
| 9,509,315 B2 | 11/2016 | McCaughan et al. | |
| 9,876,505 B1 | 1/2018 | Dai et al. | |
| 9,998,122 B2 | 6/2018 | Hamilton et al. | |
| 10,103,736 B1 | 10/2018 | Powell et al. | |
| 10,171,086 B2 | 1/2019 | McCaughan et al. | |
| 10,177,298 B1 | 1/2019 | Taylor et al. | |
| 10,186,858 B2 | 1/2019 | Klaus et al. | |
| 10,197,440 B2 | 2/2019 | Na'afi | |
| 10,262,776 B2 | 4/2019 | Choi et al. | |
| 10,361,703 B2 | 7/2019 | Najafi | |
| 10,386,229 B2 | 8/2019 | Najafi et al. | |
| 10,396,733 B2 | 8/2019 | Najafi et al. | |
| 10,454,014 B2 | 10/2019 | Najafi et al. | |
| 10,566,516 B2 | 2/2020 | Najafi | |
| 10,573,800 B1 | 2/2020 | Najafi | |
| 10,586,910 B2 | 3/2020 | Najafi | |
| 10,620,044 B2 | 4/2020 | Thompson et al. | |
| 10,651,325 B2 | 5/2020 | Najafi et al. | |
| 2001/0026426 A1 * | 10/2001 | Heismann | H10N 60/30 174/125.1 |
| 2002/0149453 A1 | 10/2002 | Snitchler et al. | |
| 2003/0087503 A1 | 5/2003 | Sakaguchi et al. | |
| 2005/0153843 A1 | 7/2005 | Kubota | |
| 2005/0197254 A1 | 9/2005 | Stasiak et al. | |
| 2006/0073979 A1 | 4/2006 | Thieme et al. | |
| 2006/0183327 A1 | 8/2006 | Moon | |
| 2006/0270224 A1 | 11/2006 | Song et al. | |
| 2007/0217098 A1 * | 9/2007 | Kruger | H10N 60/30 361/19 |
| 2008/0026234 A1 | 1/2008 | Sambasivan et al. | |
| 2010/0026447 A1 | 2/2010 | Keefe et al. | |
| 2010/0171098 A1 | 7/2010 | Suzuki | |
| 2011/0108803 A1 | 5/2011 | Deligianni et al. | |
| 2011/0254053 A1 | 10/2011 | Goupil et al. | |
| 2012/0267604 A1 * | 10/2012 | Tian | H10K 85/221 977/891 |
| 2013/0012392 A1 | 1/2013 | Tanaka et al. | |
| 2013/0090244 A1 | 4/2013 | Shinzato et al. | |
| 2013/0143744 A1 | 6/2013 | Marsili et al. | |
| 2013/0150245 A1 * | 6/2013 | Smith | G01J 5/023 250/214 R |
| 2013/0341594 A1 | 12/2013 | Mohseni et al. | |
| 2014/0113828 A1 | 4/2014 | Gilbert et al. | |
| 2014/0299751 A1 | 10/2014 | Tang et al. | |
| 2015/0018218 A1 | 1/2015 | Lakrimi et al. | |
| 2015/0080225 A1 * | 3/2015 | Nomura | H01B 12/16 505/231 |
| 2015/0179916 A1 | 6/2015 | Pramanik et al. | |
| 2015/0200041 A1 * | 7/2015 | Mitsuhashi | H01B 12/06 505/410 |
| 2015/0348681 A1 | 12/2015 | Huh | |
| 2016/0028402 A1 | 1/2016 | Mccaughan et al. | |
| 2016/0028403 A1 * | 1/2016 | McCaughan | H10N 60/205 326/104 |
| 2016/0322145 A1 * | 11/2016 | Daibo | H10N 60/203 |
| 2017/0133127 A1 * | 5/2017 | Yamaguchi | H01F 6/06 |
| 2017/0186933 A1 | 6/2017 | Sunter et al. | |
| 2018/0012682 A1 * | 1/2018 | Ichiki | H10N 60/80 |
| 2018/0033944 A1 | 2/2018 | Ladizinsky et al. | |
| 2018/0090661 A1 * | 3/2018 | McCaughan | H10N 60/84 |
| 2018/0145664 A1 | 5/2018 | Herr et al. | |
| 2018/0269373 A1 * | 9/2018 | Weidlich | H10N 60/203 |
| 2018/0294401 A1 * | 10/2018 | Tuckerman | H01B 3/306 |
| 2018/0337323 A1 * | 11/2018 | Yamaguchi | H10N 60/0801 |
| 2018/0364097 A1 | 12/2018 | Najafi | |
| 2018/0374979 A1 | 12/2018 | Nozawa | |
| 2019/0027672 A1 | 1/2019 | Megrant | |
| 2019/0035904 A1 | 1/2019 | Najafi | |
| 2019/0035999 A1 | 1/2019 | Najafi | |
| 2019/0044051 A1 | 2/2019 | Caudillo et al. | |
| 2019/0109595 A1 | 4/2019 | Najafi | |
| 2019/0228893 A1 * | 7/2019 | Betz | H01R 4/68 |

(56) References Cited

U.S. PATENT DOCUMENTS

| | | | |
|---|---|---|---|
| 2019/0288132 | A1 | 9/2019 | Wang et al. |
| 2019/0378874 | A1 | 12/2019 | Rosenblatt et al. |
| 2020/0027502 | A1* | 1/2020 | Berggren ............... H10N 60/35 |
| 2020/0066962 | A1 | 2/2020 | Najafi |
| 2020/0080890 | A1 | 3/2020 | Najafi et al. |
| 2020/0111944 | A1 | 4/2020 | Moodera et al. |
| 2020/0176662 | A1 | 6/2020 | Dayton et al. |
| 2020/0194656 | A1 | 6/2020 | Najafi |
| 2020/0194909 | A1* | 6/2020 | Brittles .................. H01R 43/16 |
| 2020/0265334 | A1* | 8/2020 | Haider ............. H01L 29/66977 |

FOREIGN PATENT DOCUMENTS

| | | | |
|---|---|---|---|
| DE | 2440576 | B1 | 1/1976 |
| DE | 19714191 | C1 | 7/1998 |
| DE | 19827225 | C1 * | 12/1999 ............... H01C 7/22 |
| DE | 10131967 | A1 * | 1/2003 ............. H01L 39/16 |
| EP | 0299879 | A2 | 1/1989 |
| EP | 2424058 | A1 * | 2/2012 ............. H02G 15/34 |
| GB | 2530500 | A | 3/2016 |
| JP | S63299282 | A | 12/1988 |
| JP | H05-55647 | A | 3/1993 |
| WO | WO90/14715 | A1 | 11/1990 |
| WO | WO94/09566 | A1 | 4/1994 |
| WO | WO 2012052628 | A2 | 4/2012 |
| WO | WO-2013179690 | A1 * | 12/2013 ............. H01B 12/02 |

OTHER PUBLICATIONS

Via et al., "Magnetic and transport currents in thin film superconductors of arbitrary shape within the London approximation", J. Appl. Phys. 113, 093905 (2013), 11 pages. (Year: 2013).*

Eftekharian et al., "Plasmonic superconducting nanowire single photon detector", Optical Society of America, Optics Express, vol. 21, No. 3 (2013), 12 pages. (Year: 2013).*

Nawaz et al., "Microwave response of superconducting YBa2Cu3O7-δ nanowire bridges sustaining the critical depairing current: evidence of Josephson-like behavior", Physical Review Letters 110, 167004 (2013), 5 pages. (Year: 2013).*

Kuroiwa et al., "Short-slot hybrid coupler using linear taper in W-band", J Infrared Milli Terahz Waves, 34:815-823 (2013), 9 pages. (Year: 2013).*

Akhlaghi et al., "Gated Mode Superconducting Nanowire Single Photon Detectors," Optics Express, vol. 20, No. 2, Jan. 16, 2012, 9 pgs.

Atikian, Haig A. et al., "Superconducting Nanowire Single Photon Detector on Diamond," arXiv:1401.4490v1, physics.optics, Jan. 17, 2014, 5 pgs.

Chen, Risheng et al., "Photon-Number-Resolving Detector Based on Superconducting Serial Nanowires," IEEE Transactions on Applied Superconductivity, vol. 23, No: 1, Feb. 2013, 9 pgs.

Clem, John R. et al., "Geometry-dependent critical currents in superconducting nanocircuits," arXiv:1109.4881v1 [cond-mat.supr-con] Sep. 22, 2011, 29 pgs.

Dai, Daoxin et al., "Mode conversion in tapered submicron silicon ridge optical waveguides," Optics Express, vol. 20, No. 12, Jun. 4, 2012, 15 pgs.

Henrich, D. et al., "Geometry-inducted reduction of the critical current in superconducting nanowires," arXiv:1204.0616v2 [cond-mat-supr-con] Aug. 22, 2012, 6 pgs.

Hortensius, H.L. et al., "Critical-Current Reduction in Thin Superconducting Wires Due to Current Crowding," arXiv:1203.4253v3, [cond-mat-supr-con], May 6, 2012, 5 pgs.

Korzh, B.A. et al., "Demonstrating sub-3 ps temporal resolution in a superconducting nanowire single-photon detector," Apr. 18, 2018, 26 pgs.

Lee, S.-B. et al., "Fabrication of a self-aligned superconducting nanotransistor based NOR logic gate," Microelectronic Engineering 57-58, 2001, 7 pgs., downloaded from https://www.sciencedirect.com/scienceiarticle/abs/pii/S0167931701004269).

Marsili, F., "Single-photon detectors based on ultra-narrow superconducting nanowires," Massachusetts Institute of Technology, Department of Electrical Engineering and Computer Science, Dec. 19, 2010, 31 pgs.

Mattioli, Francesco et al., "Photon-number-resolving superconducting nanowire detectors," Superconductor Science and Technology, Aug. 24, 2015, 16 pgs.

McGaughan, "Superconducting thin film nanoelectronics," Sep. 2015, Massachusetts Institute of Technology, submitted to the Department of Electrical Engineering and Computer Science in partial fulfillment of the requirements for the degree of Doctor of Philosopy in Electrical Engineering, 22 pgs.

Murphy et al., "Nanoscale superconducting memory based on the kinetic inductance of asymmetric nanowire loops," Departmwent of Physics, University of Illinois at Urbana-Champaign, arXiv:1701.08715v2 [cond-mat.supr-con] Jun. 29, 2017, 19 pgs.

Natarajan et al., "Superconducting nanowire single-photon detectors: physics and applications", 2012, Superconduc. Sci. Technology vol. 25, p. 063001.

Quaranta et al., Superconductive Three-Terminal Amplifier/Discriminator, IEEE Transactions on Applied Superconductivity, vol. 19, No. 3, Jun. 2, 2009, 4 pgs.

Schmidt, E. et al., AIN-Buffered Superconducting NbN Nanowire Single-Photon Detector on GaAs, IEEE Transactions on Applied Superconductivity, vol. 27, No. 4, Jun. 2017, 5 pgs.

Shiino, Tatsuya et al., "Improvement of Critical Temperature of Superconducting NbTiN and NbN Thin Films Using the AIN Buffer Layer," Superconductor Science and Technology, Mar. 2010, 11 pgs.

Zhao, Qing-Yuan et al., "A compact superconducting nanowire memory element operated by nanowire cryotrons," Massachusetts Institute of Technology, Department of Electrical Engineering and Computer Science, Nov. 22, 2017, 20 pgs.

PsiQuantum Corp., International Search Report and Written Opinion, PCT/US2018/033042, dated Aug. 28, 2018, 13 pgs.

PsiQuantum Corp., International Search Report and Written Opinion, PCT/US2018/033041, dated Jul. 27, 2018, 16 pgs.

PsiQuantum Corp., International Search Report and Written Opinion, PCT/US2018/044091, dated Nov. 7, 2018, 13 pgs.

PsiQuantum Corp., Invitation to Pay Additional Fees/Partial Search Report, PCT/US2018/037892, dated Aug. 20, 2018, 16 pgs.

PsiQuantum Corp., Invitation to Pay Additional Fees/Partial Search Report, PCT/US2018/037892, dated Aug. 20, 2018, 18 pgs.

PsiQuantum Corp., Invitation to Pay Additional Fees/Partial Search Report, PCT/US2018/054414, dated Jan. 24, 2019, 21 pgs.

PsiQuantum Corp., International Search Report and Written Opinion, PCT/US2018/054414, dated Mar. 20, 2019, 21 pgs.

Najafi, Office Action dated Dec. 12, 2018, U.S. Appl. No. 16/028,288, 6 pgs.

Najafi, Notice of Allowance dated Apr. 5, 2019, U.S. Appl. No. 16/028,288, 10 pgs.

Najafi, Office Action dated Sep. 21, 2018, U.S. Appl. No. 16/028,293, 8 pgs.

Najafi, Final Office Action dated Mar. 1, 2019 U.S. Appl. No. 16/028,293, 5 pgs.

Najafi, Notice of Allowance dated Sep. 21, 2018, U.S. Appl. No. 16/012,520, 9 pgs.

Najafi, Office Action, U.S. Appl. No. 16/136,124, dated Apr. 4, 2019, 9 pgs.

Najafi, Quayle Office Action, U.S. Appl. No. 16/151,180, dated Jan. 31, 2019, 5pgs.

Najafi, Notice of Allowace, U.S. Appl. No. 16/151,180, dated Mar. 14, 2019, 5 pgs.

Najafi, Notice of Allowance U.S. Appl. No. 16/151,190, dated Feb. 6, 2019, 11 pgs.

Najafi, Notice of Allowance U.S. Appl. No. 16/151,190, dated Mar. 28, 2019, 5 pgs.

Najafi, Office Action, U.S. Appl. No. 16/046,815, dated Feb. 4, 2019, 9 pgs.

Najafi, Office Action, U.S. Appl. No. 16/046,807, dated Mar. 18, 2019, 10 pgs.

Najafi, Office Action, U.S. Appl. No. 16/107,143, dated Mar. 19, 2019, 11 pgs.

(56) References Cited

OTHER PUBLICATIONS

PsiQuantum Corp., International Search Report and Written Opinion, PCT/US2019/017687, dated Apr. 30, 2019, 8 pgs.
Stanfield, CMOS-Compatible, Piezo-Optomechanically Tunable Photonics for Visible Wavelengths and Cryogenic, Temperatures, vol. 27, Issue 20, pp. 28588-28605, 2019.
PsiQuantum Corp., International Search Report, PCT/US2019/017691, dated Apr. 23, 2019, 7 pgs.
PsiQuantum Corp., International Search Report and Written Opinion, PCT/US2019/030019, dated Jul. 17, 2019, 8 pgs.
PsiQuantum Corp., PCT/US2018/044091, International Preliminary Report on Patentability, dated Jan. 28, 2020, 6 pgs.
Najafi, Non-Final Office Action, U.S. Appl. No. 16/664,716, dated Apr. 1, 2020, 14 pgs.
PsiQuantum, International Search Report / Written Opinion, PCT/US2019/051853, dated. Jan. 27, 2020, 13 pgs.
PsiQuantum, International Preliminary Report on Patentability, PCT/US12018/033041, dated Nov. 26, 2019, 8 pgs.
PsiQuantum, International Preliminary Report on Patentability, PCT/US2018/054414, dated Apr. 8, 2020, 15 pgs.
Psiquantum, International Search Report / Written Opinion, PCT/US2018/037892, dated Oct. 17, 2018, 18 pgs.
PsiQuantum, International Preliminary Report on Patentability, PCT/US2018/037892, dated Dec. 17, 2019, 12 pgs.
Najafi, Non-Final Office Action, U.S. Appl. No. 16/553,068, dated Apr. 1, 2020, 11 pgs.
Najafi, Non-Final Office Action, U.S. Appl. No. 16/544,718, dated Aug. 17, 2020, 6 pgs.
Najafi, Non-Final Office Action, U.S. Appl. No. 16/656,506, dated Aug. 13, 2020, 18 pgs.
Najafi, Notice of Allowance, U.S. Appl. No. 16/553,068, dated Sep. 18, 2020, 8 pgs.
Najafi, Notice of Allowance, U.S. Appl. No. 16/473,550, dated Sep. 24, 2020, 8 pgs.
Najafi, Notice of Allowance, U.S. Appl. No. 16/473,550, dated Nov. 3, 2020, 2 pgs.
Najafi, Notice of Allowance, U.S. Appl. No. 16/553,068, dated Nov. 12, 2020, 2 pgs.
Najafi, Notice of Allowance, U.S. Appl. No. 16/656,506, dated Nov. 3, 2020, 12 pgs.
Najafi, Final Office Action, U.S. Appl. No. 16/664,716, dated Oct. 16, 2020, 14 pgs.
Najafi, Notice of Allowance, U.S. Appl. No. 16/473,547, dated Dec. 9, 2020, 8 pgs.
Najafi, Notice of Allowance, U.S. Appl. No. 16/543,256, dated Dec. 9, 2020, 12 pgs.
Chung, Non-Final Office Action, U.S. Appl. No. 16/849,829, dated Aug. 21, 2020, 5 pgs.
Chung, Notice of Allowance, U.S. Appl. No. 16/849,829, dated Dec. 8, 2020, 5 pgs.
PsiQuantum Corp., International Search Report / Written Opinion, PCT/US20/28519, dated Jan. 12, 2021, 9 pgs.
PsiQuantum Corp., Notice of Allowance, U.S. Appl. No. 16/849,829, dated Mar. 1, 2021, 8 pgs.
PsiQuantum Corp., Notice of Allowance, U.S. Appl. No. 16/544,718, dated Feb. 5, 2021, 6 pgs.
PsiQuantum Corp., Notice of Allowance, U.S. Appl. No. 16/664,716, dated Jan. 28, 2021, 8 pgs.
PsiQuantum Corp., Notice of Allowance, U.S. Appl. No. 16/473,547, dated Jan. 27, 2021, 2 pgs.
PsiQuantum Corp., Notice of Allowance, U.S. Appl. No. 16/543,256, dated Feb. 4, 2021, 2 pgs.
PsiQuantum Corp., Notice of Allowance, U.S. Appl. No. 16/544,718, dated Mar. 12, 2021, 2 pgs.
PsiQuantum Corp., Notice of Allowance, U.S. Appl. No. 16/544,718, dated Mar. 24, 2021, 2 pgs.
PsiQuantum Corp., Notice of Allowance, U.S. Appl. No. 16/849,829, dated Apr. 5, 2021, 2 pgs.

* cited by examiner

TAPERED CONNECTORS FOR SUPERCONDUCTOR CIRCUITS

RELATED AND PRIORITY APPLICATIONS

This application is a continuation of U.S. application Ser. No. 16/575,274, filed Sep. 18, 2019, which claims priority to U.S. Provisional Patent Application 62/733,553, entitled "Tapered Connectors for Superconductor Circuits," filed Sep. 19, 2018, each of which is hereby incorporated by reference in its entirety.

TECHNICAL FIELD

This relates generally to superconducting circuits, including but not limited to, tapered connectors for superconducting circuits.

BACKGROUND

Superconductors are materials capable of operating in a superconducting state with zero electrical resistance under particular conditions. One parameter for operating in a superconducting state is current density. If current density exceeds a superconducting threshold density the superconductor will operate in a non-superconducting state. Geometric shapes such as corners may lead to current crowding effects that result in the current density exceeding the superconducting threshold density at some locations. Moreover, mathematically-optimal tapered connectors can be hard to manufacture.

SUMMARY

There is a need for circuits and devices with more efficient and effective methods for reducing or minimizing current crowding in manufactured superconductors. Such circuits, devices, and methods optionally complement or replace conventional systems, devices, and methods for reducing or minimizing current crowding effects.

In one aspect, some embodiments include a superconducting circuit. The superconducting circuit includes: (1) a first component having a first connection point (e.g., a terminal), the first connection point having a first width; (2) a second component having a second connection point, the second connection point having a second width that is larger than the first width; and (3) a connector electrically connecting the first connection point and the second connection point, the connector including: (a) a first taper having a first slope and a non-linear shape; (b) a second taper having a second slope; and (c) a connecting portion connecting the first taper to the second taper, the connecting portion having a third slope that is less than the first slope and less than the second slope.

In another aspect, some embodiments include a superconducting circuit that includes: (1) a first component having a first connection point, the first connection point having a first width; (2) a second component having a second connection point, the second connection point having a second width that is larger than the first width; and (3) a connector electrically connecting the first connection point and the second connection point, the connector including: (a) a first taper positioned adjacent the first connection point and having a non-linear shape; and (b) a second taper positioned adjacent the second connection point and having a linear shape.

In another aspect, some embodiments include a superconducting component that includes: (1) a first portion having a first width; (2) a second portion having a second width; (3) a curved portion coupling the first portion and the second portion, wherein the curved portion has a third width that is at least three times greater than the first width and at least three times greater than the second width; and (4) tapered portions connecting the curved portion to the first portion and the second portion.

In yet another aspect, some embodiments include a superconducting circuit that include: (1) a first component having a first connection point, the first connection point having a first width; (2) a second component having a second connection point, the second connection point having a second width that is larger than the first width; and (3) a connector electrically connecting the first connection point and the second connection point, the connector comprising a tapered portion shaped to minimize current crowding effects, the tapering defined by a taper formula meeting certain current crowding reduction criteria and elongated by a preset factor.

Thus, devices and circuits are provided with methods for reducing or minimizing current crowding by use of tapered connectors, thereby increasing the effectiveness, efficiency, and user satisfaction with such circuits and devices.

BRIEF DESCRIPTION OF THE DRAWINGS

For a better understanding of the various described embodiments, reference should be made to the Detailed Description below, in conjunction with the following drawings in which like reference numerals refer to corresponding parts throughout the figures.

DETAILED DESCRIPTION

Figure 1A:
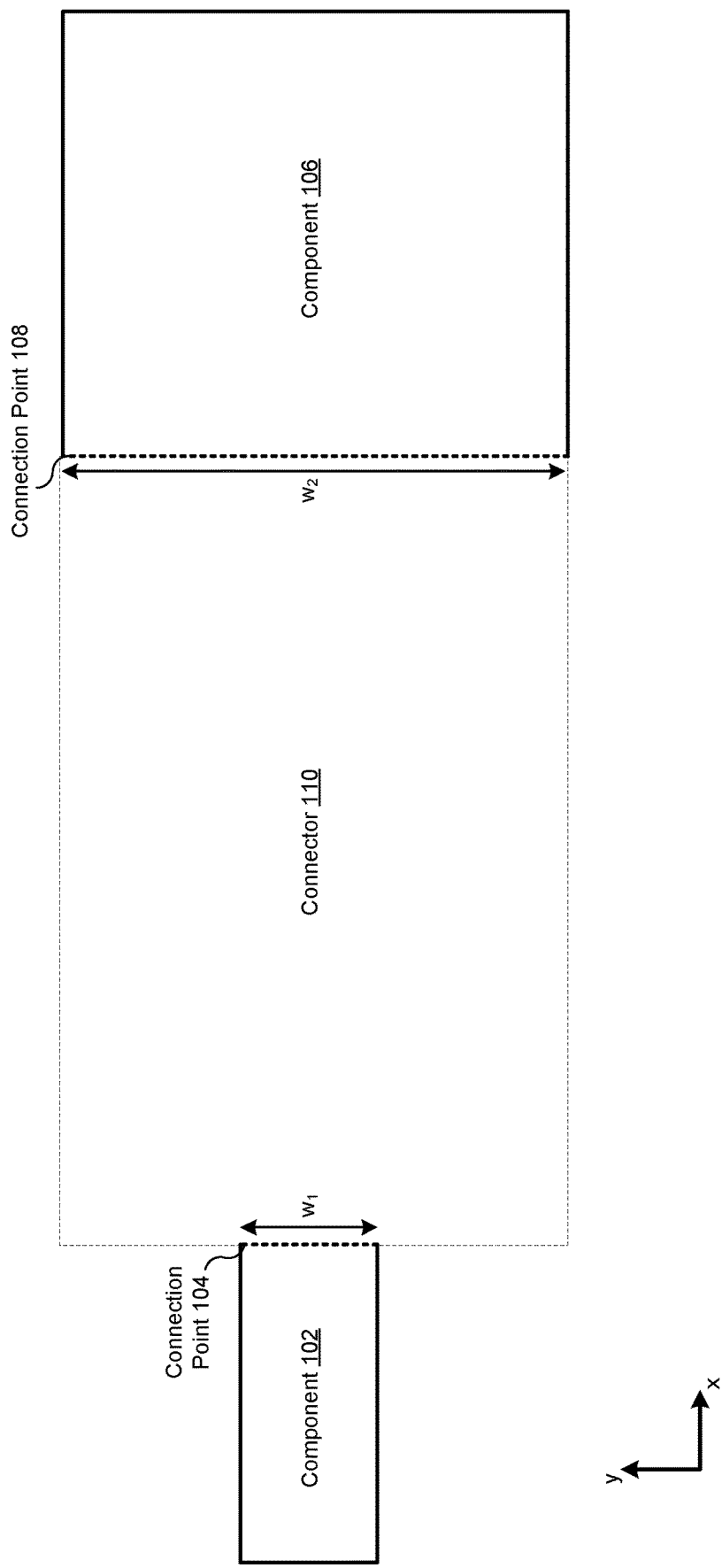
FIGS. 1A-1D are diagrams illustrating representative connectors in accordance with some embodiments.

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Many modifications and variations of this disclosure can be made without departing from its spirit and scope, as will be apparent to those skilled in the art. The specific embodiments described herein are offered by way of example only, and the disclosure is to be limited only by the terms of the appended claims, along with the full scope of equivalents to which such claims are entitled.

A threshold superconducting current for a superconductor component is dependent on current density within the superconductor component. Current crowding effects at corners or curves lead to increased current density, which in turn leads to a lower threshold superconducting current. Therefore, it is important to shape the superconductor component to reduce or minimize current crowding effects (e.g., through the use of tapered connectors).

Mathematically-optimal tapers can minimize current crowding in superconductor devices. However, mathematically-optimal tapers can be difficult to manufacture in some circumstances, such as with superconductor devices having width(s) that are less than 1 micron. For example, drift during an e-beam process leads to stepping of a mathematically-optimal curve, which increases current crowding effects. As another example, a lithography process may over-expose or under-expose parts of a steep curve, which also increase current crowding effects. The present disclosure describes superconducting tapers that both prevent current crowding and are manufacturable.

Equations (1)-(3) below are examples of curves that meet certain current crowding reduction criteria (e.g., are mathematically-optimal curves). Equation (1) defines a curve along the x-axis and y-axis for a component with a 90-degree turn.

Curve for 90-degree Turn      Equation 1

$$y_{90}(x) = W\left\{1 + \frac{2}{\pi}\sinh^{-1}\left[\frac{1}{\sinh[(\pi/2W)(x-W)]}\right]\right\}$$

In Equation (1) above, W is the width of the component prior to (e.g., outside, but adjacent to) the turn (e.g., a straight portion of the component). Equation (2) defines a curve along the x-axis and y-axis for a component with a 180-degree turn (e.g., a u-shaped turn).

$$y_{180}(x) = \pm(2W/\pi)\cos^{-1}[\exp(\pi x/2W)/2]$$    Equation 2—Curve for 180-degree Turn In Equation (2) above, W is the width of the component prior to (e.g., outside, but adjacent to) the turn. Equation (3) shows a complex-number function zeta, $\zeta(c)$, indicating a curve along the x-axis and y-axis for a tapered component.

$$\zeta(c) = \frac{i}{\pi}\left[W\tan^{-1}\left(\frac{\sqrt{c(\alpha)-\gamma}}{\sqrt{\gamma+1}}\right) + A\tan^{-1}\left(\frac{\sqrt{\gamma-1}}{\sqrt{c(\alpha)-\gamma}}\right)\right]$$

Equation 3—Complex-number Function for Tapered Portion

In Equation (3) above, W is the width of the narrow end of the tapered portion (e.g., $w_1$ in FIG. 1A), A is the width of the wider end of the tapered portion (e.g., $w_2$ in FIG. 1A), gamma ($\gamma$) is defined by Equation (4), and $c(\alpha)$ is defined by Equation (5).

$$\gamma = \frac{(A^2 + W^2)}{(A^2 - W^2)}$$

Equation 4—Relationship Between Wide and Narrow Ends $$c(\alpha) = \cos(\alpha) + i\sin(\alpha)$$    Equation 5—Angle Mapping As the angle $\alpha$ in Equation (5) is varied from 0 to $\pi$, the x and y coordinates for a curved boundary of the tapered portion can be obtained via Equations (6) and (7) below.

$$x(\alpha) = \text{Re}(\zeta(\alpha))$$    Equation 6—X-coordinate of Curved Boundary $$y(\alpha) = \text{Im}(\zeta(\alpha))$$    Equation 7—Y-coordinate of Curved Boundary As shown in Equations (6) and (7) above, the x-coordinate is obtained from the real portion of the function zeta and the y-coordinate is obtained from the imaginary portion of the function zeta.

FIGS. 1A-1D are diagrams illustrating representative connectors in accordance with some embodiments. FIG. 1A shows a first component, labeled component 102, and a second component, component 106, coupled by connector 110 in accordance with some embodiments. Component 102 has a connection point, connection point 104, with a first width, $w_1$. Component 106 has a connection point, connection point 108, with a second width, $w_2$. As shown in FIG. 1A, $w_2$ is greater than $w_1$. In some embodiments, connector 110 is adapted to reduce current crowding within the connector. In some embodiments, the first component, the second component, and the connector are arranged on a same layer of superconducting material. In some embodiments, the first component, the second component, and the connector are composed of a same material (e.g., a superconducting material such as NbGe or NbN). In some embodiments, the first and second components and the connector are formed via etching of a superconducting film. In some embodiments, the first component is a photon detector (e.g., an SNSPD). In some embodiments, the second component is a pad or via. In some embodiments, the first or second component is an inductor or resistor.

In various embodiments, connector 110 has various tapered shapes to reduce or minimize current crowding effects as current flows between component 102 and component 106. In some embodiments, if the ratio of $w_2$ to $w_1$ is less than a preset factor (e.g., 3, 4, or 5, or more generally a predefined value between 2.5 and 5), connector 110 has a tapered shape meeting one or more current crowding reduction criteria (e.g., mathematically-optimal tapered shape), such as the tapered shape set forth in Equations (3)-(7) above. In some embodiments, if the ratio of $w_2$ to $w_1$ is greater than the preset factor, connector 110 includes a series of tapers (e.g., FIGS. 1B-1D), or a tapered shape that is elongated from a tapered shape meeting one or more current crowding reduction criteria (e.g., mathematically-optimal tapered shape), such as the tapered shape set forth in Equations (3)-(7) above (e.g., the elongated tapered shape shown in FIG. 4B). In some embodiments, each taper is a tapered region of superconducting material having two ends, each end of the tapered region having a distinct width. In some embodiments, the tapers of connector 110 (e.g., the tapers shown in FIGS. 1B-1D) are shaped so as to reduce current crowding within the connector. In some embodiments, the tapers of connector 110 (e.g., the tapers shown in FIGS. 1B-1D) are adapted (e.g., designed) based on a lithography process used to form the connector. In some embodiments, connector 110 includes multiple tapered regions and the tapered regions have respective first derivatives that are matched at connection points of the tapered regions.

Figure 1B:
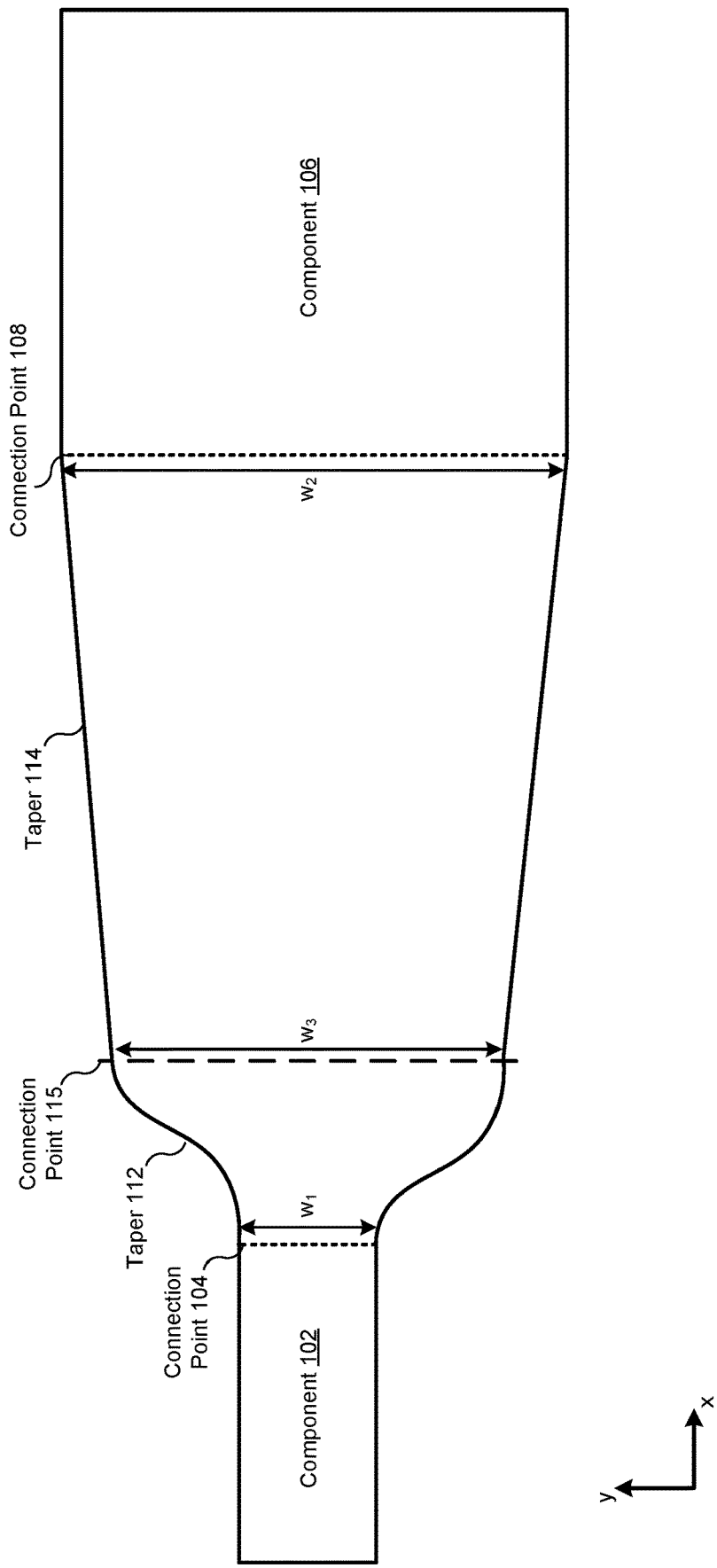

FIG. 1B shows connector 110 as a set of tapered elements, taper 112 and taper 114, connected at connection point 115 in accordance with some embodiments. As shown in FIG. 1B, taper 112 is a non-linear taper (e.g., the tapered shape set forth in Equations (3)-(7) above) decreasing from an intermediate width $w_3$ to the width, $w_1$, of connection point 104. Taper 114 is a linear taper (e.g., has linear boundaries) decreasing from the width, $w_2$, of connection point 108 to the intermediate width $w_3$. In some embodiments, taper 112 and taper 114 have a same first derivative at connection point 115 (e.g., are slope-matched at the connection point). In some embodiments, a first taper (e.g., the taper 112) narrows from an intermediate width $w_3$ to a first width $w_1$, and the intermediate width is less than five times the first width. In some embodiments, the intermediate width (IW) and first width (FW), satisfy the following: $3*FW \leq IW \leq 5*FW$. Alternatively, in some embodiments, the intermediate width (IW) and first width (FW), satisfy the following: $2*FW \leq IW \leq 5*FW$.

Figure 1C:
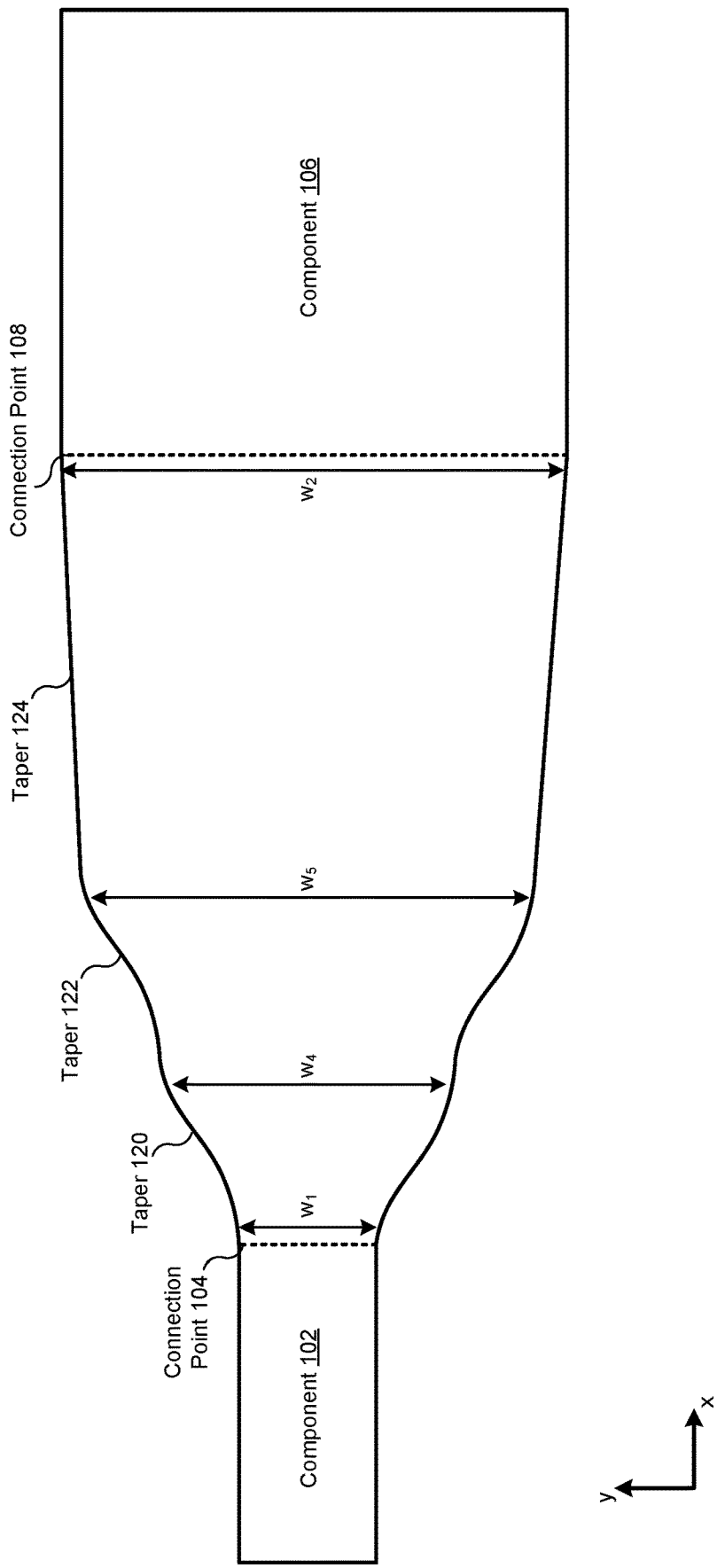

FIG. 1C shows connector 110 as another set of tapered elements, taper 120, taper 122, and taper 124, in accordance with some embodiments. As shown in FIG. 1C, taper 120 is a non-linear taper (e.g., the tapered shape set forth in Equations (3)-(7) above) decreasing from an intermediate width $w_4$ to the width, $w_1$, of connection point 104. Taper 122 is a non-linear taper (e.g., the tapered shape set forth in Equations (3)-(7) above) decreasing from a second intermediate width $w_5$ to the intermediate width $w_4$. Taper 124 is a linear taper decreasing from the width, $w_2$, of connection point 108 to the intermediate width $w_5$.

Figure 1D:
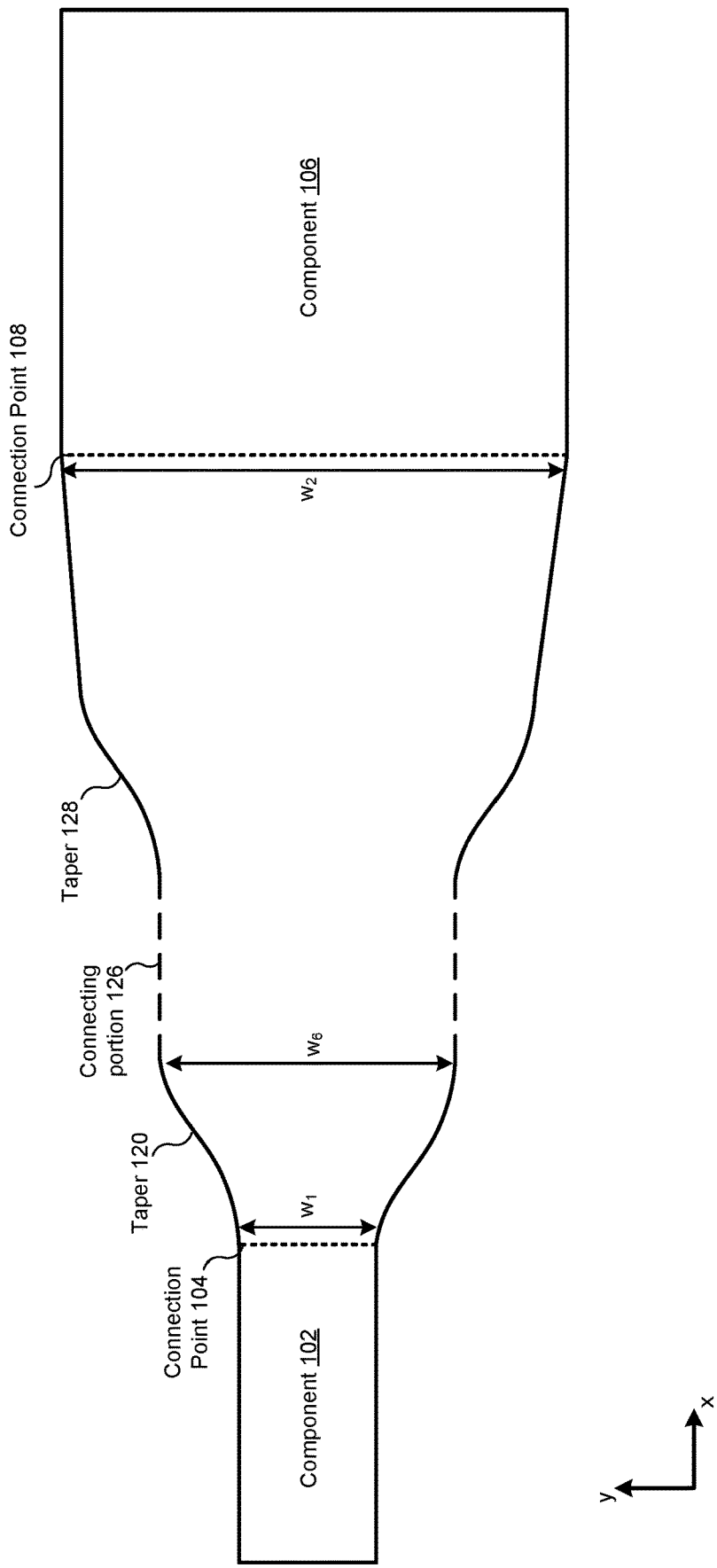

FIG. 1D shows connector 110 as a set of tapered elements, taper 120 and taper 128, connected via a connecting portion 126 in accordance with some embodiments. As shown in FIG. 1D, taper 120 is a non-linear taper (e.g., the tapered shape set forth in Equations (3)-(7) above) decreasing from an intermediate width $w_6$ to the width, $w_1$, of connection point 104. Taper 128 is a non-linear taper decreasing from the width, $w_2$, of connection point 108 to the intermediate width $w_6$. Connecting portion 126 is a portion of connector 110 having a slope less than the slopes of tapers 120 and 128 (e.g., the connecting portion 126 has a slope of zero and each of tapers 120 and 128 includes a portion having a slope greater than zero). More generally, connection portion 126 need not be linear, but includes a portion having a slope (e.g., typically, but not necessarily having a slope of zero) that is less than a slope (e.g., a maximum slope of at least a portion of) of the tapers to which it is connected.

Figure 2:
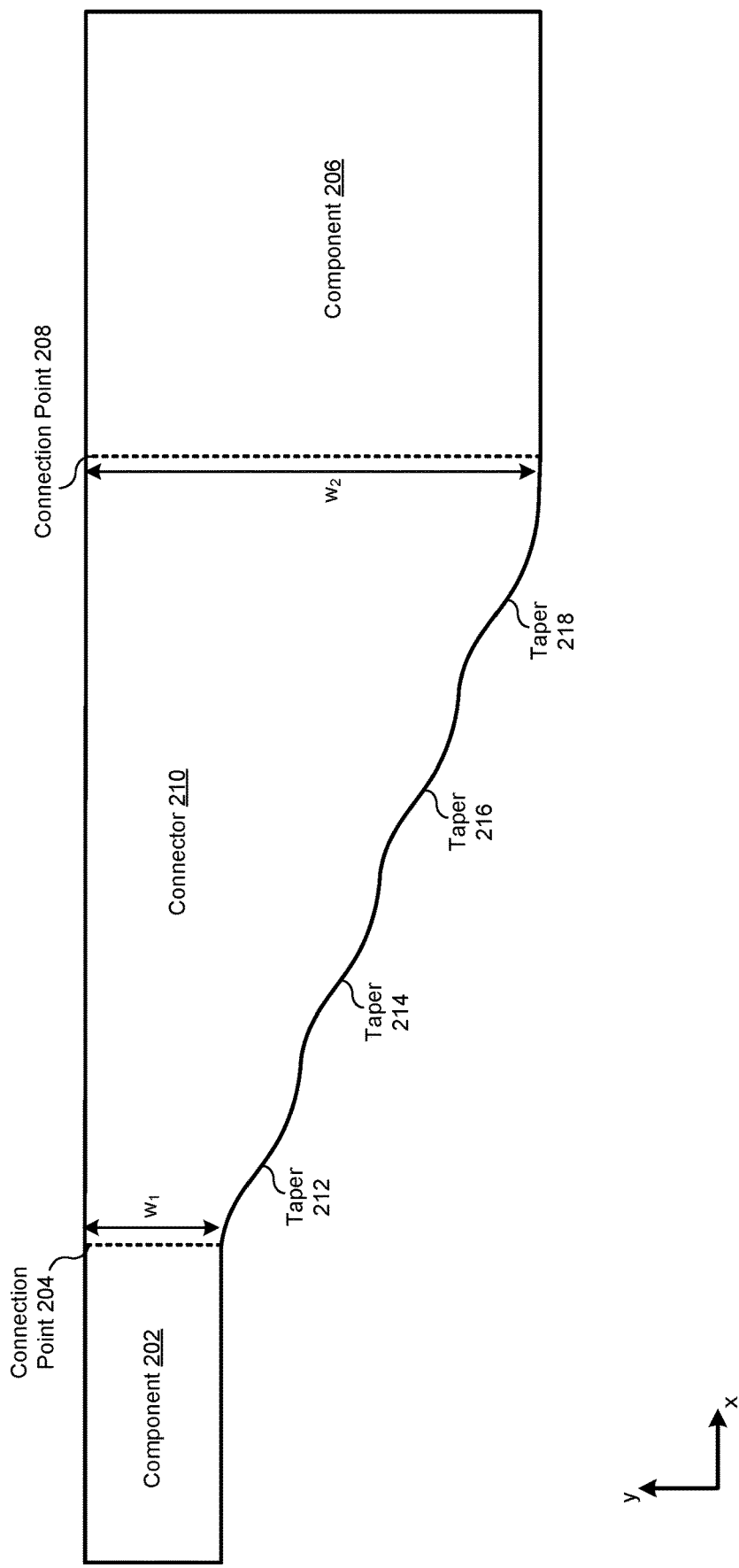
FIG. 2 is a diagram illustrating another representative connector in accordance with some embodiments.

FIG. 2 is a diagram illustrating connector 210 in accordance with some embodiments. FIG. 2 shows a first component, labeled component 202, and a second component, component 206, coupled by connector 210 in accordance with some embodiments. Component 202 has a connection point, connection point 204, with a first width, $w_1$. Component 206 has a connection point, connection point 208, with a second width, $w_2$. As shown in FIG. 2, $w_2$ is greater than $w_1$. FIG. 2 also shows connector 210 as a set of asymmetrical tapered portions, tapers 212, 214, 216, and 218. In accordance with some embodiments, the tapered portions are slope-matched at the respective connection points to reduce (e.g., minimize) current crowding effects.

Figure 3:
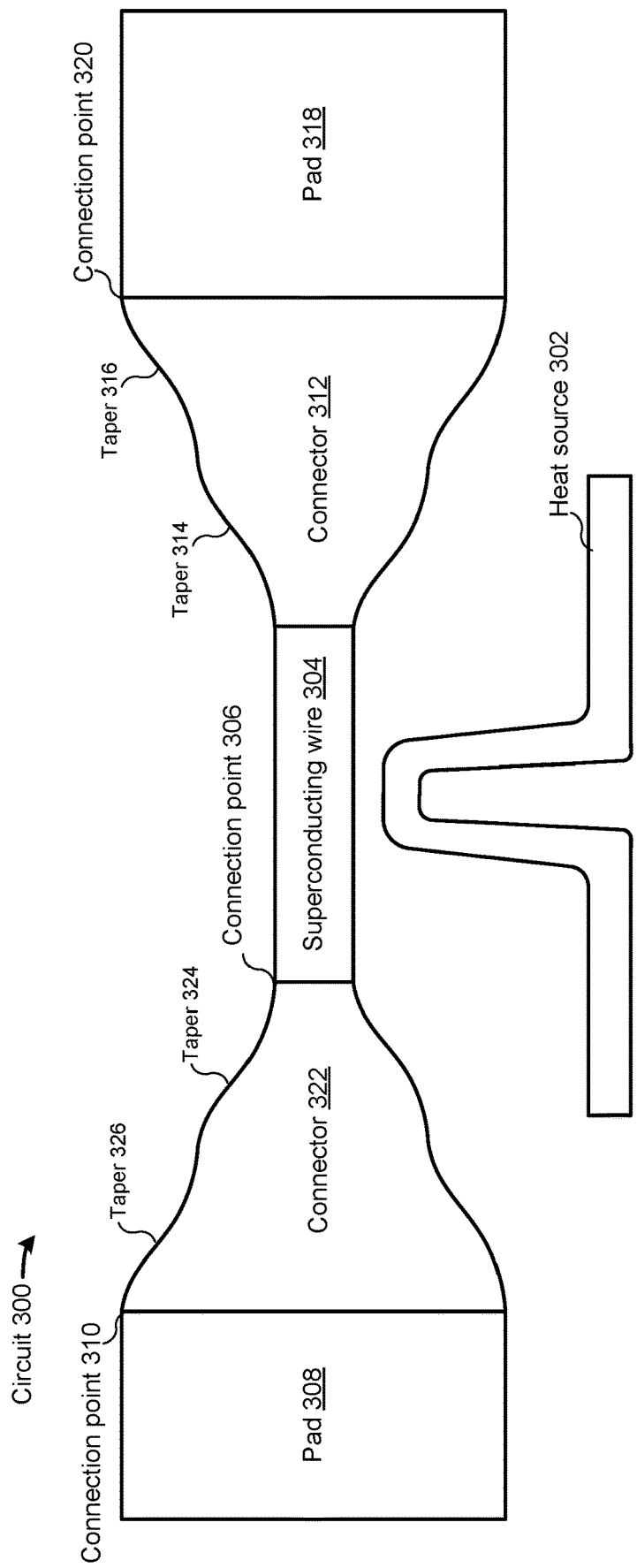
FIG. 3 is a diagram illustrating a representative circuit in accordance with some embodiments.

FIG. 3 is a diagram illustrating circuit 300 in accordance with some embodiments. FIG. 3 shows a superconducting wire 304 electrically-connected to pads 308 and 318 via tapered connectors 322 and 312. Tapered connector 312 (which includes tapers 314 and 316) is connected to pad 318 at connection point 320. Tapered connecter 322 (which includes tapers 324 and 326) is connected to pad 308 at connection point 310. Tapered connector 322 is further connected to superconducting wire 304 at connection point 306. FIG. 3 also shows a heat source 302 (e.g., a superconductor, conductor, or semiconductor) thermally-coupled to superconducting wire 304. In accordance with some embodiments, heat source 302 selectively generates heat to transition superconducting wire 304 from a superconducting state to a non-superconducting state. In accordance with some embodiments, a current source (not shown) is electrically-coupled to one of pads 318 and 308 such that current flows between pads 318 and 308 through superconducting wire 304. In accordance with some embodiments, a readout component (not shown) is electrically-coupled to one of pads 318 and 308 and configured to determine a state of superconducting wire 304 (e.g., based on an amount of current received at the readout component). In some embodiments, one or more additional components (not shown) are coupled between pads 318 and 308, such as an inductor, a resistor, or a capacitor.

Figure 4A:
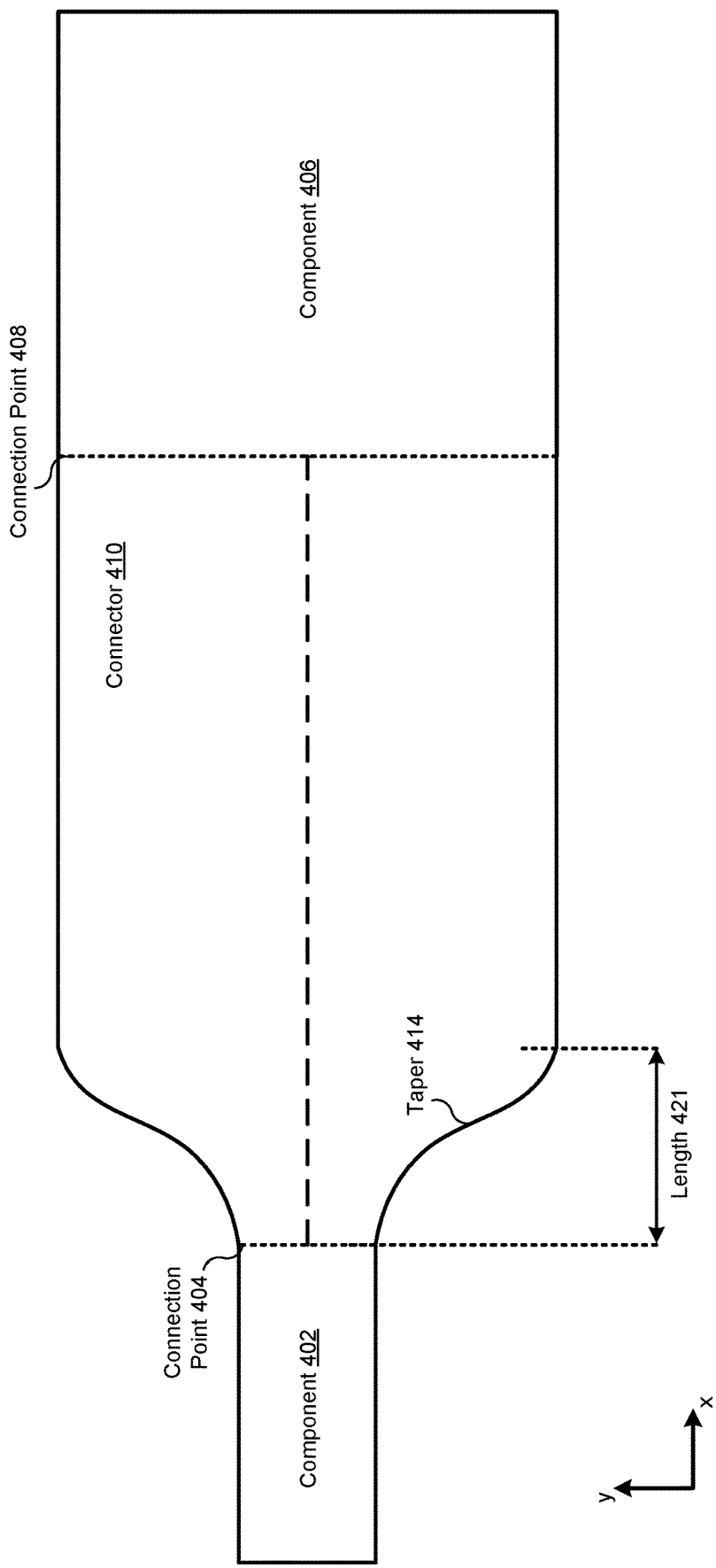
FIGS. 4A-4B are diagrams illustrating representative connectors in accordance with some embodiments.
Figure 4B:
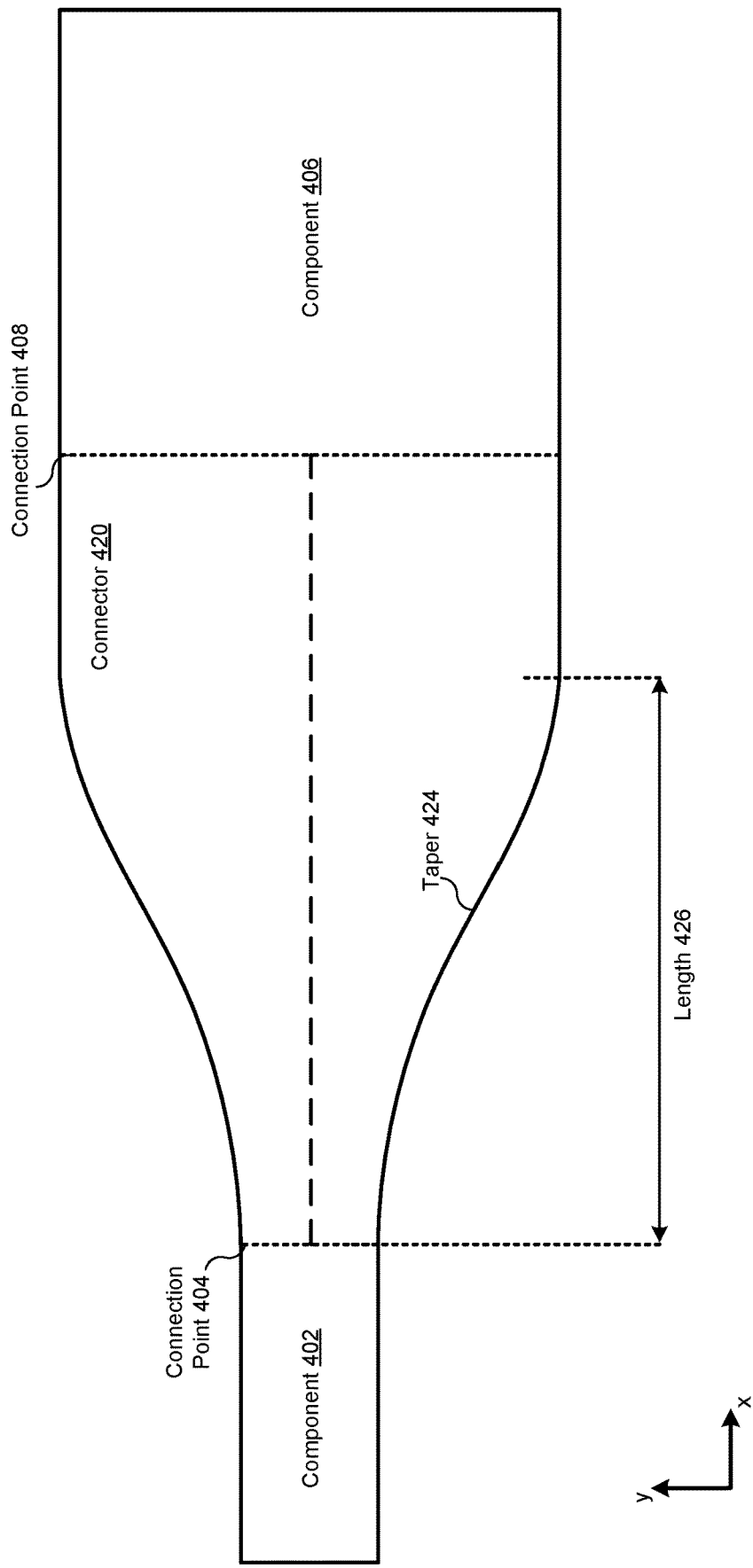

FIGS. 4A-4B are diagrams illustrating representative connectors in accordance with some embodiments. FIG. 4A shows a connector 410 (which connects component 406 at connection point 408 to component 402 at connection point 404) having a tapered portion 414 with a first length 421. FIG. 4B shows a connector 420 having a tapered portion 424 with a second length 426. In accordance with some embodiments, tapered portion 414 utilizes a taper shaped in accordance with Equations (3)-(7) and tapered portion 424 utilizes an elongated version of taper 414 (e.g., elongated in accordance with Equation (8) below), such that length 426 is greater than length 421 and a maximum slope of tapered portion 414 is greater than a maximum slope of tapered portion 424. Equation (8) below shows an elongation factor to be applied to a mathematically-defined tapered shape (e.g., the tapered shape defined in Equations (3)-(7) above).

Elongation Factor     Equation 8

$$\alpha = \frac{(\Delta x * m) + L}{L}$$

In Equation (8) $\Delta x$ is a displacement value due to drift during a fabrication process, m is a constant (e.g., a constant in the range of 5 to 10), and L is a length of the mathematically-defined tapered shape.

As discussed previously, reducing a maximum slope of the tapered portions reduces the impact of lithography inaccuracies in some circumstances. Moreover, a vertically-symmetric taper, as shown in FIG. 4B, reduces a current crowding impact of vertical drift during a lithography process for the connector.

Figures 5A, 5B:
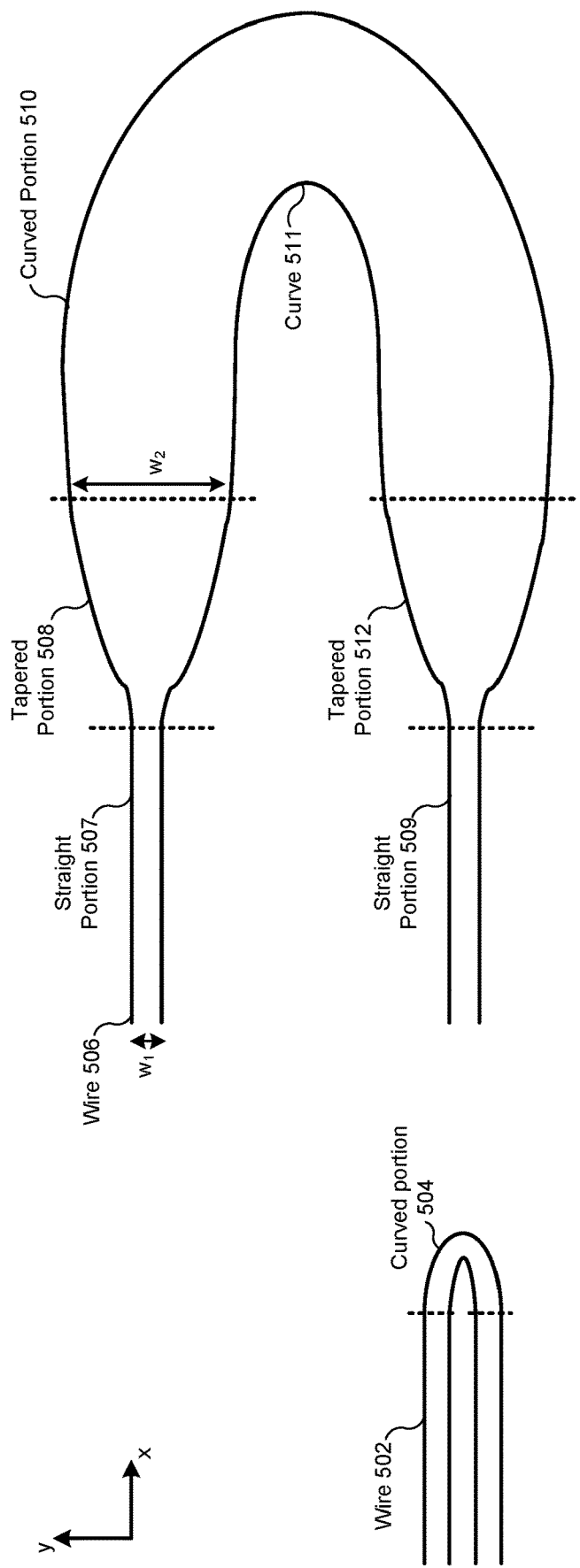
FIGS. 5A-5C are diagrams illustrating representative connectors in accordance with some embodiments.
Figure 5C:
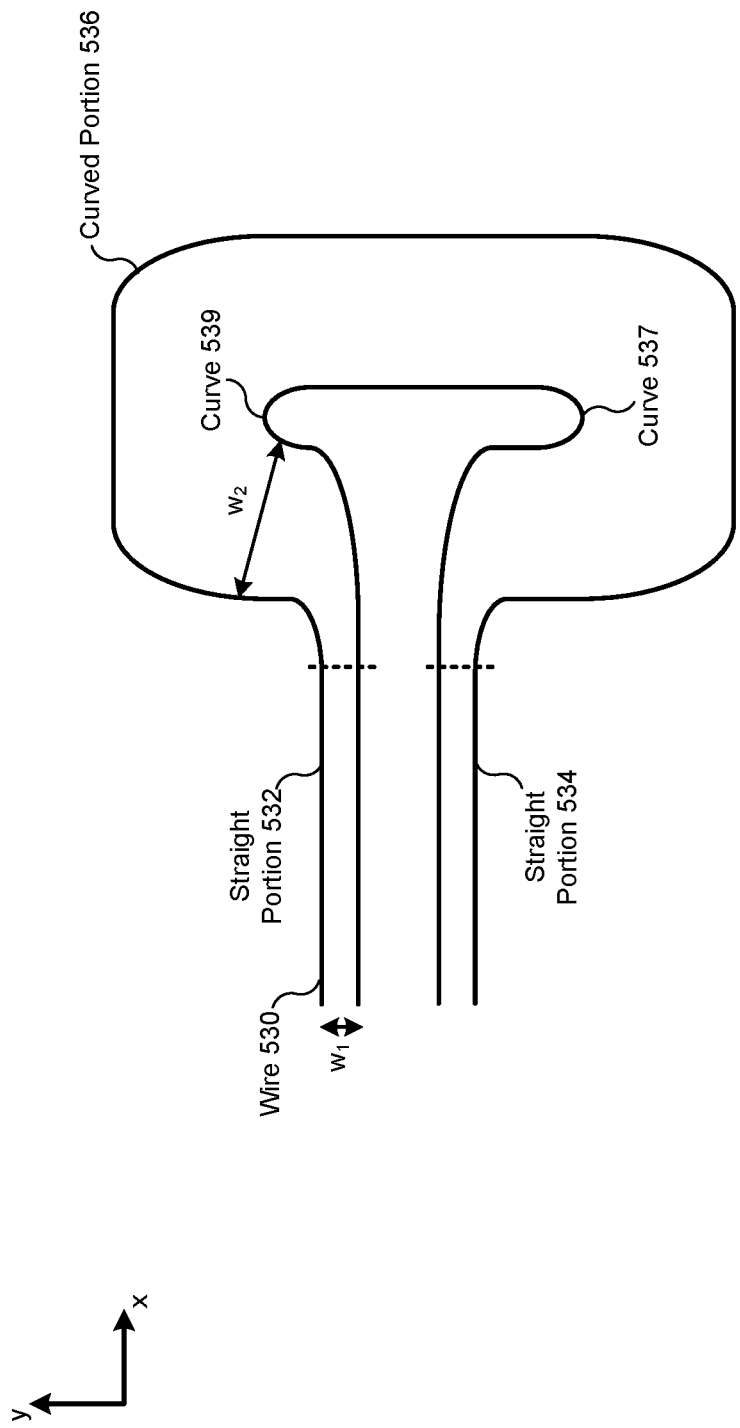

FIGS. 5A-5C are diagrams illustrating representative connectors in accordance with some embodiments. FIG. 5A shows wire 502 including a curved portion 504 (e.g., a u-shaped curved portion). Wire 502 in FIG. 5A has a substantially same width throughout (e.g., within 5%, 10%, 20% of the same width), and thus suffers from current crowding within the curved portion 504 in some circumstances.

FIG. 5B shows a wire 506 having straight portions 507 and 509 coupled to a curved portion 510 via tapered portions 508 and 512 respectively. FIG. 5B shows straight portion 507 having a width $w_1$ and curved portion 510 having a width $w_2$ that is greater than $w_1$. In some embodiments, the inner curve of curved portion 510 is shaped in accordance with Equation (2) above. In some embodiments, the ratio of $w_2$ to $w_1$ is in the range of 3 to 5. In some embodiments, the ratio of $w_2$ to $w_1$ is greater than 3 and the tapered portions 508 and 512 each include a series of tapered portions (e.g., similar to those shown in FIGS. 1B-1D). In some circumstances, having the width $w_2$ be greater than the width $w_1$ decreases current crowding effects in the wire 506 (e.g., as compared to current crowding effects in the wire 502). In some embodiments, straight portions 507 and 509 are substantially parallel (e.g., within 5 degrees, 10 degrees, or 20 degrees of parallel). In some embodiments, straight portions 507 and 509 are each linear in shape (e.g., have linear boundaries). In some embodiments, curved portion 510 is u-shaped (e.g., turns 180 degrees). In some embodiments, curved portion 510 includes a first end and a second end, opposite the first end; and the first end and the second end are substantially parallel (e.g., within 5 degrees, 10 degrees, or 20 degrees of parallel). In some embodiments, curved portion 510 is shaped to reduce or minimize current crowding effects (e.g., curve 511 is shaped in accordance with Equation (2)). In some embodiments, tapered portions 508 and 512 are shaped to reduce or minimize current crowding effects in the tapered portions. In some embodiments, tapered portions 508 and 512 are shaped to also reduce (e.g., minimize) current crowding effects in curved portion 510. In some embodiments, tapered portions 508 and 512 are non-linear in shape (e.g., are shaped in accordance with Equations (3)-(7) above).

FIG. 5C shows a wire 530 having straight portions 532 and 534 in close proximity to one another, e.g., close enough that there is insufficient space to utilize the curved portion 510 of FIG. 5B. FIG. 5C also shows straight portions 532 and 534 coupled to one another via curved portion 536. In some embodiments, inner curves 537 and 539 of curved portion 536 are shaped in accordance with Equation (2). As shown in FIG. 5C the curved portion 536 has a width $w_2$, that is greater than $w_1$, and includes tapered portions (e.g., shaped in accordance with Equations (3)-(7) above) to reduce or minimize current crowding in wire 530. In some embodiments, the ratio of $w_2$ to $w_1$ is in the range of 3 to 5. In some circumstances, having the width $w_2$ be greater than the width $w_1$ decreases current crowding effects in the wire 530 (e.g., as compared to current crowding effects in the wire 502 of FIG. 5A).

It will also be understood that, although the terms first, second, etc. are, in some instances, used herein to describe various elements, these elements should not be limited by these terms. These terms are only used to distinguish one element from another. For example, a first current could be termed a second current, and, similarly, a second current could be termed a first current, without departing from the scope of the various described embodiments. The first current and the second current are both currents, but they are not the same condition unless explicitly stated as such.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, a "superconducting circuit" or "superconductor circuit" is a circuit having one or more superconducting materials. For example, a superconductor switch circuit is a switch circuit that includes one or more superconducting materials. As used herein, a "superconducting" material is a material that is capable of operating in a superconducting state (under particular conditions). For example, a superconducting material is a material that operates as a superconductor (e.g., operates with zero electrical resistance) when cooled below a particular temperature (e.g., a threshold temperature) and having less than a threshold current flowing through it. A superconducting material is also sometimes called herein a superconduction-capable material. In some embodiments, the superconducting materials operate in an "off" state where little or no current is present. In some embodiments, the superconducting materials can operate in a non-superconducting state during which the materials have a non-zero electrical resistance (e.g., a resistance in the range of one thousand to ten thousand ohms). For example, a superconducting material supplied with a current greater than a threshold superconducting current for the superconducting material transitions from a superconducting state having zero electrical resistance to a non-superconducting state having non-zero electrical resistance.

As used herein, a "wire" is a section of material configured for transferring electrical current. In some embodiments, a wire includes a section of material conditionally capable of transferring electrical current. For example, a wire made of a superconducting material that is capable of transferring electrical current while the wire is maintained at a temperature below a threshold temperature. As another example, a wire made of semiconducting material is capable of transferring electrical current while the wire is maintained at a temperature above a freeze-out temperature. A cross-section of a wire (e.g., a cross-section that is perpendicular to a length of the wire) optionally has a regular (e.g., flat or round) shape or an irregular shape. While some of the figures show wires having rectangular shapes, any shape could be used. In some embodiments, a length of a wire is greater than a width or a thickness of the wire (e.g., the length of a wire is at least 5, 6, 7, 8, 9, or 10 times greater than the width and the thickness of the wire). In some cases, a wire is a section of a superconducting layer.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A superconducting circuit, comprising:
  a first component having a first connection point, the first connection point having a first width;
  a second component having a second connection point, the second connection point having a second width that is larger than the first width;
  a superconducting connector shaped to reduce current crowding, the superconducting connector electrically connecting the first connection point and the second connection point, the superconducting connector comprising:
    a first taper positioned adjacent the first connection point and having a non-linear shape; and
    a second taper positioned adjacent the second connection point; and
  a connecting portion connecting the first taper to the second taper, wherein:
    the first taper and the connecting portion connect at a third connection point; and respective first derivatives of the first taper and the connecting portion are matched at the third connection point.

2. The superconducting circuit of claim 1, wherein the first component, the second component, and the superconducting connector are arranged linearly.

3. The superconducting circuit of claim 1, wherein the first component, the second component, and the superconducting connector are arranged on a same layer of superconducting material.

4. The superconducting circuit of claim 1, wherein the first component and the second component are superconducting components.

5. The superconducting circuit of claim 1, wherein the second taper has a linear shape.

6. The superconducting circuit of claim 1, wherein the second taper has a non-linear shape.

7. The superconducting circuit of claim 1, wherein:
the first component is a superconducting wire; and
the superconducting circuit further includes a heat source configured to generate heat to transition the superconducting wire from a superconducting state to a non-superconducting state.

8. The superconducting circuit of claim 7, further comprising a readout component coupled to the second component, wherein the readout component is configured to determine a state of the superconducting wire, the state being the superconducting state or the non-superconducting state.

9. The superconducting circuit of claim 7, wherein:
the superconducting connector is a first superconducting connector;
the first component has a fifth connection point; and
the superconducting circuit further comprises:
a third component having a sixth connection point;
a second superconducting connector shaped to reduce current crowding, the second superconducting connector electrically connecting the fifth connection point and the sixth connection point, the superconducting connector comprising:
a third taper positioned adjacent the fifth connection point and having a non-linear shape; and
a fourth taper positioned adjacent the sixth connection point.

10. The superconducting circuit of claim 9, wherein the fifth connection point is opposite the first connection point.

11. The superconducting circuit of claim 9, wherein the first component, the second component, the third component, the first superconducting connector, and the second superconducting connector are arranged linearly.

12. The superconducting circuit of claim 1, wherein each of the first taper and the second taper are asymmetric about an axis connecting the first connection point with the second connection point.

13. The superconducting circuit of claim 1, wherein the first taper narrows from an intermediate width to the first width, wherein the intermediate width is less than five times the first width.

14. The superconducting circuit of claim 1, wherein the second taper and the connecting portion connect at a fourth connection point; and
wherein respective first derivatives of the second taper and the connecting portion are matched at the fourth connection point.

15. The superconducting circuit of claim 1, wherein the first component is a photon detector.

16. The superconducting circuit of claim 1, wherein the second component is a pad or via.

* * * * *